United States Patent [19]

Iwasa

[11] Patent Number: 5,471,423

[45] Date of Patent: Nov. 28, 1995

[54] NON-VOLATILE SEMICONDUCTOR MEMORY DEVICE

[75] Inventor: Shoichi Iwasa, Tokyo, Japan

[73] Assignee: Nippon Steel Corporation, Tokyo, Japan

[21] Appl. No.: 243,621

[22] Filed: May 16, 1994

[30] Foreign Application Priority Data

May 17, 1993 [JP] Japan .................. 5-139093
May 17, 1993 [JP] Japan .................. 5-139094

[51] Int. Cl.$^6$ .................................. G11C 11/34
[52] U.S. Cl. ............. 365/185.01; 365/218; 257/315
[58] Field of Search ........................ 365/185, 104, 365/218, 230.03; 257/314, 315

[56] References Cited

U.S. PATENT DOCUMENTS

| | | | |
|---|---|---|---|
| 4,959,812 | 9/1990 | Momodomi et al. | 365/185 |
| 5,299,162 | 3/1994 | Kim et al. | 365/185 X |
| 5,299,166 | 3/1994 | Suh et al. | 365/185 X |

FOREIGN PATENT DOCUMENTS

| | | |
|---|---|---|
| 1-133290 | 5/1989 | Japan . |
| 1-173398 | 7/1989 | Japan . |
| 1-282873 | 11/1989 | Japan . |

Primary Examiner—Joseph A. Popek
Attorney, Agent, or Firm—Pollock, Vande Sande & Priddy

[57] ABSTRACT

A non-volatile semiconductor memory device comprises a plurality of semiconductor layers of a first conductivity type, extending parallelly in a column direction and isolated from each other; a plurality of memory cells disposed in a matrix of columns and rows, each having source and drain regions of a second conductivity type, a channel region between the source and drain regions and a gate structure formed on the channel region with a gate insulating layer interposed therebetween and including a floating gate, an interlayer insulating layer, and a control gate. The memory cells are divided into a plurality of groups formed on the semiconductor layers, respectively, so that all the memory cell groups are formed on one of the semiconductor layers and the drain-source circuits of the memory cells of each group are connected to form a series electrical path. A plurality of first bit lines are provided to the plurality of memory cell groups, respectively, each connected to the semiconductor layer on which an associated memory cell group is formed and a plurality of second bit lines are provided to the plurality of memory cell groups, respectively, each second bit line connected to one end of the series electrical path provided to an associated memory cell group. Each of a plurality of word line is connected to the control gates of the memory cell group disposed in one of the rows.

17 Claims, 15 Drawing Sheets

ERASING OPERATION

WRITING OPERATION

READING OPERATION

NON-VOLATILE SEMICONDUCTOR MEMORY DEVICE

BACKGROUND OF THE INVENTION

1. Field of the Invention

The invention relates to a non-volatile semiconductor memory device and, more particularly, to a non-volatile semiconductor memory device having memory cells which are integrated at high density comparable with an NAND type non-volatile semiconductor memory device and capable of operating with high speed random access.

2. Description of the Related Art

A non-volatile semiconductor memory to which an attention is paid as a substitute for a magnetic disk memory device or the like is constructed in a manner such that a floating gate and a control gate are laminated with an interposed electrical insulating layer onto a channel region between source and drain regions of a field effect transistor (FET) and its conductive/non-conductive state which is variable in accordance with a charging state of the floating gate is used as information of one bit to be stored. There are known various kinds of non-volatile semiconductor memories different with respect to the manner in which the charging state of the floating gate is changed. As a typical memory, there is an EEPROM in which information can be electrically erased and written by using an FN tunnel phenomenon between the floating gate and the channel region.

In a non-volatile semiconductor memory device in which the above EEPROM is used as a unit memory cell, a memory plane is constructed by two-dimensionally arranging the memory cells. With respect to an arrangement of such memory cells and a mutual connecting of them, the NOR type and the NAND type are known. Both of them have a merit and a demerit. That is, the NOR type has an advantage such that an accessing speed is high because it can be operated with random access. However, it has a drawback such that an integration density is low. To the contrary, the NAND type has high integration density, but its processing speed is slow because it cannot be operated with random access. For the details of the construction and operation of the non-volatile semiconductor memory device of the NAND type mentioned above, please see for example, JP-A-1-133290, JP-A-1-173398 and JP-A-1-282873.

As mentioned above, the non-volatile semiconductor memory devices of the NAND type and NOR type have the merits and demerits with respect to the integration density and the high operating speed.

In the conventional NAND type memory device, it is required to erase the data stored in the memory cells which are arranged near a bit line but unnecessary to be written and to rewrite therein the data before erasure. In addition, the writing operation must be simultaneously executed to all of the memory cells which are connected to a common word line. Therefore, the original data must be again rewritten into the memory cells whose original data is not to be altered. Consequently, there are also problems such that the times of erasing and writing operations increase so that the tunnel oxide films deteriorate and the reliability decreases. Furthermore, in the conventional NAND type memory device, since the tunnel voltage is supplied from the bit line, the FN tunneling to the floating gate has a tendency to occur more easily from the drain/source regions rather than the channel region and therefore the tunnel oxide film near the drain/source region easily deteriorates.

SUMMARY OF THE INVENTION

It is a main object of the present invention to provide a non-volatile semiconductor memory device which has memory cells which are integrated at high density comparable with the non-volatile semiconductor memory device of the NAND type and capable of operating with high speed random access comparable with the non-volatile semiconductor memory device of the NOR type.

Another object of the invention is to provide a non-volatile semiconductor memory device in which, in the erasing operation, only one or more memory cells to be erased are selectively erased and the unnecessary erasing operation can be avoided and, therefore, the unnecessary writing operation can also be avoided.

According to the present invention, the above objects are accomplished by a non-volatile semiconductor memory device which comprises: a plurality of semiconductor layers of a first conductivity type, extending parallelly in a column direction and isolated from each other and a plurality of memory cells disposed in a matrix of columns and rows, each memory cell having source and drain regions of a second conductivity type different from the first conductivity type, a channel region formed between the source and drain regions and a gate structure formed on the channel region with a gate insulating layer interposed therebetween and including a floating gate, an interlayer insulating layer and a control gate. The memory cells are divided into a plurality of memory cell groups formed on the semiconductor layers, respectively, such that the memory cells disposed in each column constitute one of the memory cell groups and the drain-source circuits of the memory cells of each group are connected in series to provide a series electrical path. A plurality of first bit lines are provided to the plurality of memory cell groups, respectively, each first bit line being connected to the semiconductor layer on which an associated one of the plurality of memory cell groups is formed, a plurality of second bit lines are provided to the plurality of memory cell groups, respectively, each second bit line being connected to one end of the series electrical path provided to an associated one of the plurality of memory cell groups and a plurality of word lines are provided, each word line being connected to the control gates of the memory cell group disposed in one of the rows.

In the non-volatile semiconductor memory device of the invention, since the drain-source circuits of the plurality of memory cells constituting the memory cell group arranged in each column are serially connected by the first bit line, the memory device has substantially the same construction as that of the conventional non-volatile semiconductor memory device of the NAND type, and the memory cells can be integrated at a high density. Each group of the memory cell groups is formed on the isolated semiconductor layer, independent second bit lines are provided for the plurality of memory cell groups, respectively, and the channel regions of the memory cells of each memory cell group are connected by the independent first bit line. Therefore, the plurality of memory cells connected to the same word line are distinguished by the memory cell groups so that any one of them can be selected by the first bit line.

Therefore, by selecting the memory cell to be written or erased by the first bit line and the word line, the selected memory cell located at an intersection point of the first bit line and the word line can be controlled for the charging state of its floating gate independently of the other memory cells on the basis of the FN tunneling between the control gate and the channel region. By selecting one of the first bit lines and one of the word lines, the writing or erasing operation can be selectively performed to only one memory cell. That is, any one of the memory cells can be accessed at random and the writing or erasing operation can be performed.

As for the reading operation, by selecting one of the second bit lines and one of the word lines, data can be read out from only one of the selected memory cells.

As mentioned above, since each memory cell group has substantially the same construction as that of the conventional NAND type, a similar high integration density is realized. In addition to the second bit line corresponding to the bit line of the NAND type, the first bit line to commonly control the potentials of the channel regions of all of the memory cells which belong to each memory cell group is newly provided, so that the erasing, writing, and reading operations are realized on a memory cell unit basis.

DESCRIPTION OF THE PREFERRED EMBODIMENTS

An embodiment of the present invention will be described with reference to the drawings.

Figure 1:
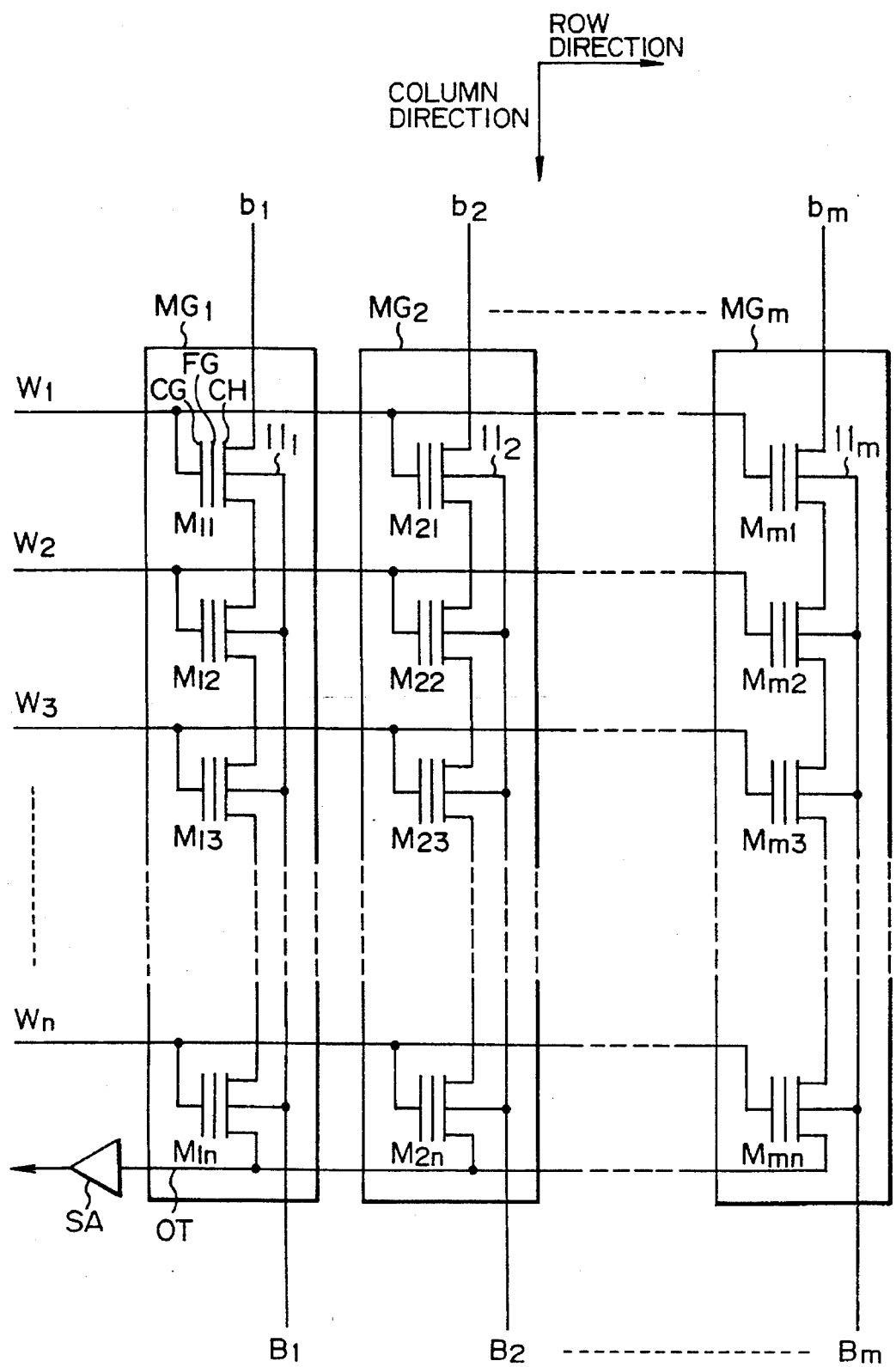
FIG. 1 is a circuit diagram of a memory block constituting a non-volatile semiconductor memory device according to an embodiment of the present invention.

FIG. 1 is an equivalent circuit diagram of a non-volatile semiconductor memory device according to an embodiment of the present invention. In the non-volatile semiconductor memory device, a memory cell group MG1 is formed by arranging a plurality of non-volatile memory cells M11, M12, M13, ..., M1n in the column direction. A memory cell group MG2 is formed by arranging a plurality of non-volatile memory cells M21, M22, M23, ..., M2n in the column direction. In a manner similar to the above, a memory cell group MGm is formed by arranging a plurality of non-volatile memory cells Mm1, Mm2, Mm3, ..., Mmn in the column direction. By arranging such a plurality of memory cell groups MG1, MG2, ..., MGm in the row direction, a memory block in which the memory cells M11 to Mmn are two-dimensionally arranged is formed.

Each of the memory cells M11, M12, M13, ..., M1n which belong to the memory cell group MG1 includes a source region and a drain region of a second conductivity type which are formed on the surface of a semiconductor layer $11_1$ of a first conductivity type, a channel region formed between the source and drain regions and a floating gate and a control gate which are laminated on the channel region with an interposed insulating layer. Each memory cell has a generally NAND structure such that the source region is common to the drain region of one of the adjacent memory cells and the drain region is common to the source region of the other adjacent memory cell, so that the memory cells are connected in series, the drain region of the memory cell M11 disposed at one end is connected to a sub-bit line (second bit line) b1, and the source region of the memory cell M12 disposed at the other end is connected to an output line OT. The other memory cell groups MG2 to MGm have also the same structure.

The essential features of the present invention different from the conventional non-volatile semiconductor memory device having the NAND structure reside in that semiconductor layers $11_1, 11_2, \ldots, 11_m$ of the first conductivity type, on the surfaces of which the memory cell groups MG1, MG2, ..., MGm of the NAND structure are formed, are mutually isolated in the row direction and extend in the column direction to be connected to main bit lines (first bit lines) B1, B2, ..., Bm, respectively, so that the potentials thereof can be independently controlled. The isolation in the row direction of the semiconductor layers $11_1, 11_2, \ldots, 11_m$ of the first conductivity type is realized by element-isolation insulating layers which extend in parallel with each other in the column direction at equal intervals in the row direction. The details of such an isolation will be described hereinlater. As mentioned above, by independently controlling the potentials of the semiconductor layers $11_1, 11_2, \ldots, 11_m$ of the first conductivity type by the respective main bit lines, the potentials of the channel regions can be controlled independently for the memory cell groups and can be controlled commonly for all of the memory cells in the same memory cell group.

The control gates of the memory cells of the same row which belong to the memory cell groups MG1, MG2, ..., MGm, respectively, are connected to one of word lines W1, W2, W3, ..., Wn which are mutually isolated in the column direction and extend in the row direction. Further, the non-volatile semiconductor memory device of the embodiment comprises means for selecting the memory cell to be written and erased by a combination of the main bit line B1, B2, ..., Bm and the word line W1, W2, ..., Wn and applying an operation voltage to the selected memory cell, thereby selectively making operative the memory cell located at the intersection thereof; and means for selecting the memory cell to be read out by a combination of the sub-bit line b1, b2, ..., bm and the word line W1, W2, ..., Wn and applying an operation voltage to the selected memory cell, thereby selectively making operative the memory cell located at the intersection thereof.

Figure 16:
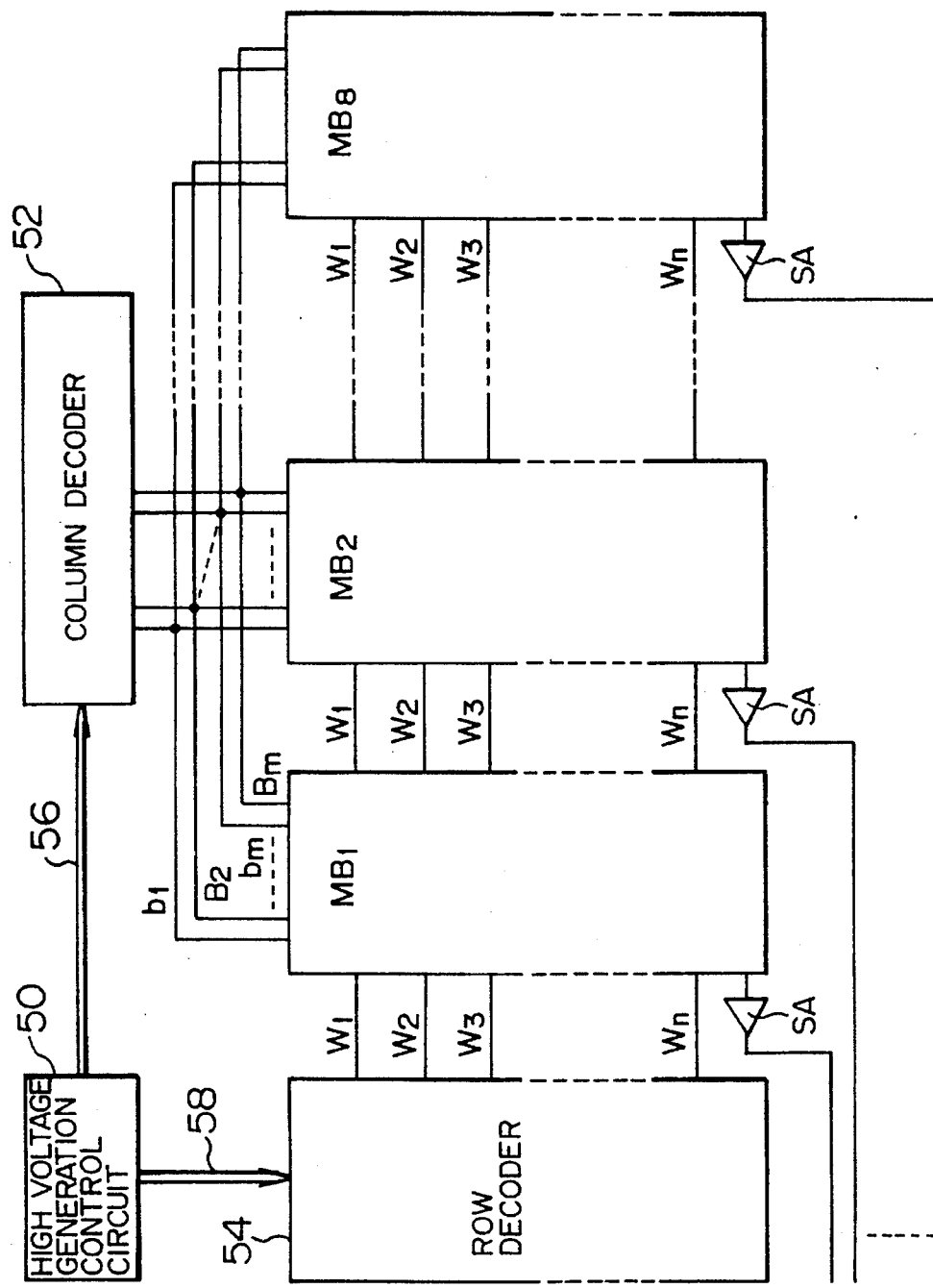
FIG. 16 is a diagram showing a circuit construction of a non-volatile semiconductor memory device according to an embodiment of the invention.

According to a typical example, each of the memory cells M11 to Mmn holds the data corresponding to one bit of the binary data of one word (eight bits) which are arranged in the direction of the word line W1 to Wn. That is, as shown in FIG. 16, eight memory blocks MB1 to MB8, each having the same construction as shown in FIG. 1, are arranged in the direction of the word lines W1 to Wn, and information of one byte is simultaneously written into or read out from the eight memory cells disposed at the same intersections defined by the word line and the main and sub-bit lines B and b in the respective memory blocks MB1 to MB8, for example, the eight memory cells M11 in the eight memory blocks MB1 to MB8.

First, the erasing operation of a memory cell unit of the non-volatile semiconductor memory device of FIG. 1 will be described with reference to FIG. 2. In the embodiment it is assumed that the erasing operation is an operation to accumulate electrons into the floating pate. The case of applying the erasing operation only to the memory cell M12 will be explained. As shown in the diagram, a positive potential of a proper level, for example, the potential of +12 volts is set to the word line W2 and the ground potential (0 volt) is set to all of the other word lines. A negative potential of a proper level, for example, the potential of −10 volts is set to the main bit line B1 and the ground potential (0 volt) is set to all of the other main bit lines B1 to Bm. All of the sub-bit lines b1 to bm are set to the open (high impedance) state. In the memory cell M12 disposed at the intersection of the word line W2 and the main bit line B1 (the semiconductor layer $11_1$ of the first conductivity type), a voltage of 22 volts is applied across its control pate and its channel region formed between the source and drain regions formed on the surface of the semiconductor layer $11_1$ of the first conductivity type. As a result, a strong electric field is generated between the channel region and the floating gate to cause the FN tunneling therebetween. The transfer and storage of electrons by the FN tunneling from the channel region to the floating gate are performed and the erasing operation is completed.

In all of the other non-selection memory cells M11 and M13 to M1n in the memory cell group MG1 to which the memory cell M12 selected for erasing belongs, the voltage of 10 volts is applied across the control gate and the channel, so that the transfer of the electrons by the FN tunneling from the channel region to the floating gate is not performed. Therefore, the charging state of the floating gate is not changed. With respect to all of the other non-selected memory cells M22 to Mm2 connected to the word line W2 commonly with the selected memory cell M12, since the voltage of 12 volts is applied across the control gate and the channel region, the transfer of the electrons by the FN tunneling from the channel region to the floating gate is not performed and the charging state of the floating gate is not changed. With respect to each of the selected memory cell M12 and the non-selected memory cells M11 and M22 in the erasing operation, an electric field between the floating gate and the channel region is calculated.

Figure 15:
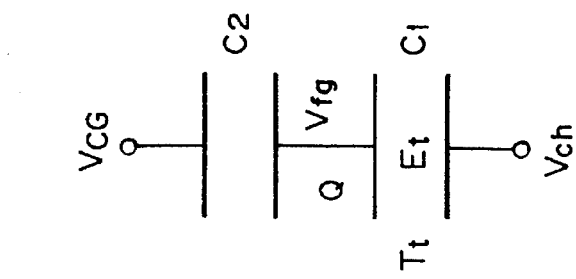
FIG. 15 is an equivalent circuit diagram showing electrical characteristics of a channel region, a floating gate, and a control gate of each memory cell.

As shown in an equivalent circuit of FIG. 15, the potentials of the floating gate, control gate, and channel are indicated by Vfg, Vcg, and Vch, respectively. An electrostatic capacity between the floating gate and the channel is indicated by C1, an electrostatic capacity between the control gate and the floating gate by C2 and a charge amount of the floating gate by Q. For simplicity of explanation, now assuming that C1=C2=C/2, the potential Vfg of the floating gate is represented by $$Vfg=0.5Vcg+0.5Vch+Q/C \quad (1)$$

Further, assuming that an interval between the floating gate and the channel (thickness of a tunnel oxide film) is equal to Tt, an electric field Et between the floating gate and the channel is given by $$\begin{aligned} Et &= (Vfg - Vch)/Tt \\ &= [0.5(Vcg - Vch) + Q/C]/Tt \end{aligned} \quad (2)$$

Then, a threshold voltage Vt in a writing state (assumes "1") of each memory cell is given by, $$Vt=Q/C2=2Q/C \quad (3)$$

From the equations (2) and (3), $$Et=0.5[(Vcg-Vch)+Vt]/Tt \quad (4)$$

In the case where Vt=−2 volts and Tt=10 nm, by setting (Vcg−Vch) to 22 volts for the selected memory cell M12, 10 volts for the non-selected memory cell M11, and 12 volts for the non-selected memory cell M22, the values of Et of the above memory cells are given by 10 MV/cm, 4 MV/cm, and 5 MV/cm, respectively. The FN tunneling can be caused only in the selected memory cell M12.

Although the erasing operation of the memory cell unit in each memory block has been described above, by simultaneously selecting one main bit line and all of the word lines, the erasing operation can be also simultaneously applied to all of the memory cells in the corresponding memory cell group in each memory block. By also simultaneously selecting one word line and all of the main bit lines, the erasing operation can be also simultaneously applied to all of the memory cells in the same row of the memory cell groups in each memory block.

Figure 3:
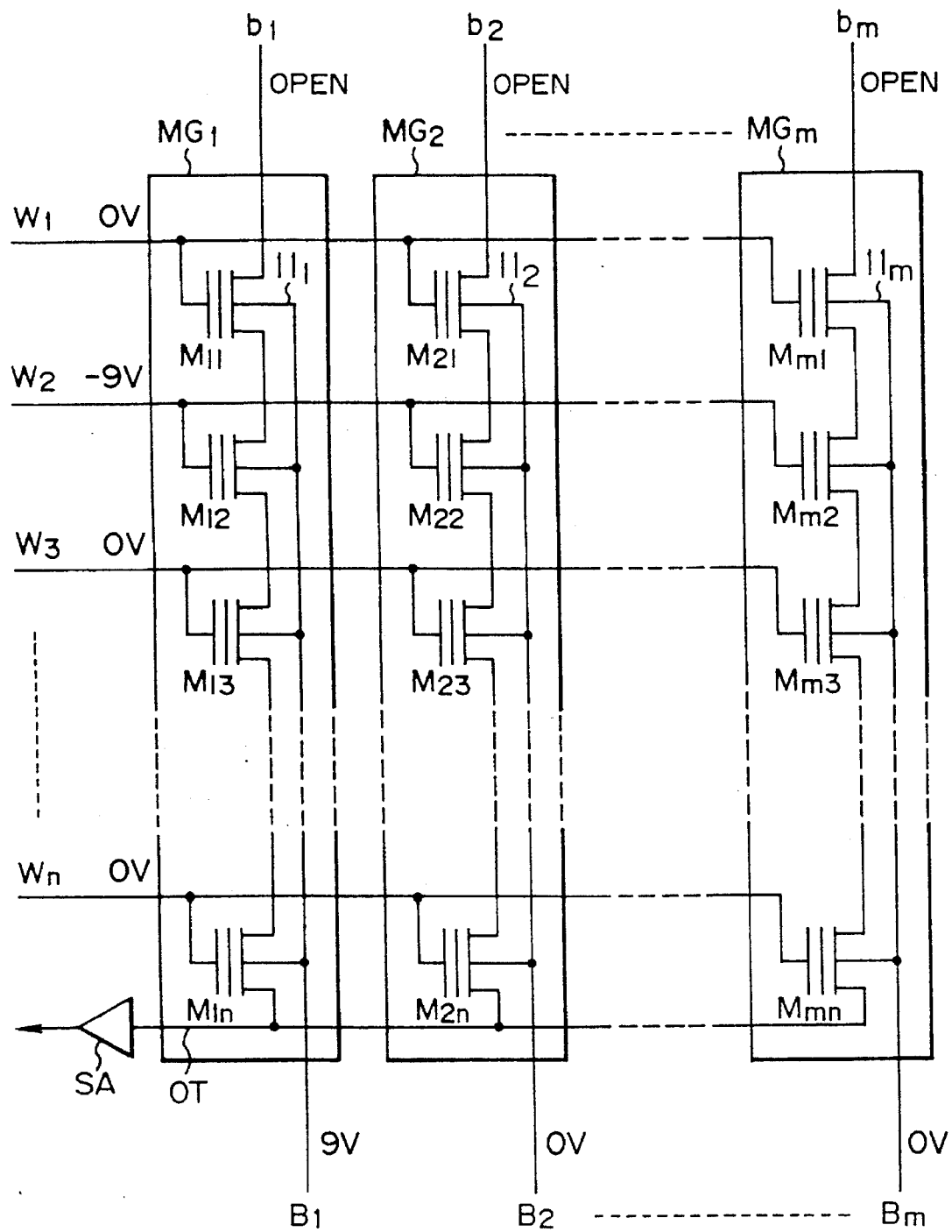
FIG. 3 is a diagram for explaining the writing operation of the non-volatile semiconductor memory device of the invention.

The writing operation of the non-volatile semiconductor memory device of the embodiment will now be described with reference to FIG. 3. The writing of "1" of the binary signal corresponds to the operation of removing the electrons from the floating gate to the channel region by the FN tunneling. The writing of "0" of the binary signal corresponds to the operation of injecting the electrons into the floating gate in a manner similar to the operation for erasing mentioned above. It is now assumed that "1" is written into only the memory cell M12. As shown in FIG. 3, a negative potential of a proper level, for example, −9 volts is set to the word line W2 and the ground potential (0 volt) is set to all of the other word lines. A positive potential at a proper level, for example, +9 volts is set to the main bit line B1 and the ground potential (0 volt) is set to all of the other main bit lines. All of the sub-bit lines b1 to bm are held in an open (high impedance) state. In the memory cell M12 disposed at the intersection between the word line W2 and the main bit line B1 (semiconductor layer $11_1$ of the first conductivity type), a strong electric field is generated between the floating gate and the channel region formed between the source and drain regions. The transfer of the electrons by the FN tunneling is performed from the floating gate to the channel region thereby completing the writing operation of "1".

When the electric field Et is calculated on the basis of the foregoing equation (4) with respect to each of the selected memory cell M12 and the non-selected memory cells M11 and M22, the values thereof are given by 10 MV/cm, 5.5 MV/cm, and 5.5 MV/cm, respectively. The transfer of the electrons from the floating gate by the FN tunneling can be caused only in the selected memory cell M11. The writing of "0" into the selected memory cell M12 can be performed substantially in the same manner as the erasing operation described in FIG. 2. In a manner similar of the erasing operation, by simultaneously selecting one main bit line and all of the word lines, the writing operation can be also simultaneously applied to all of the memory cells in the selected memory cell group. By simultaneously selecting one word line and all of the main bit lines, the writing operation can be also simultaneously applied to all of the memory cells in the same columns of the respective memory cell groups.

The reading operation of the non-volatile semiconductor memory device of the embodiment will now be described with reference to FIG. 4. The case of reading out the data of one bit stored into the memory cell M12 is now assumed. As shown in the diagram, the ground potential is set to the word line W2 and a positive potential of a proper level, for example, +5 V is set to all of the other word lines. A positive potential of a proper level, for instance, +5 V is set to the sub-bit line b1 and the ground potential (0 volt) is set to all of the other sub-bit lines. The ground potential is set to all of the main bit lines B1 to Bm.

When the binary signal stored in the selected memory cell M12 disposed at the intersection of the word line W2 and the sub-bit line b1 (semiconductor layer $11_1$ of the first conductivity type) is "1", namely, the electrons are not accumulated into its floating gate, the channel between the source and the drain is made conductive. On the other hand, when the binary signal stored into the selected memory cell M12 is "0", namely, the electrons are stored into the floating gate, the channel between the source and the drain is made non-conductive. All of the other memory cells M11 and M13 to M1n in the memory cell group MG1 to which the selected memory cell M12 belongs are made conductive irrespective of the charging state of the floating gate since the voltage of +5 volts is applied across the control gate and the channel region. A change of the current through the output line OT depending on the conduction/non-conduction of the selected memory cell M12 is read out by sense amplifier SA.

Figure 2:
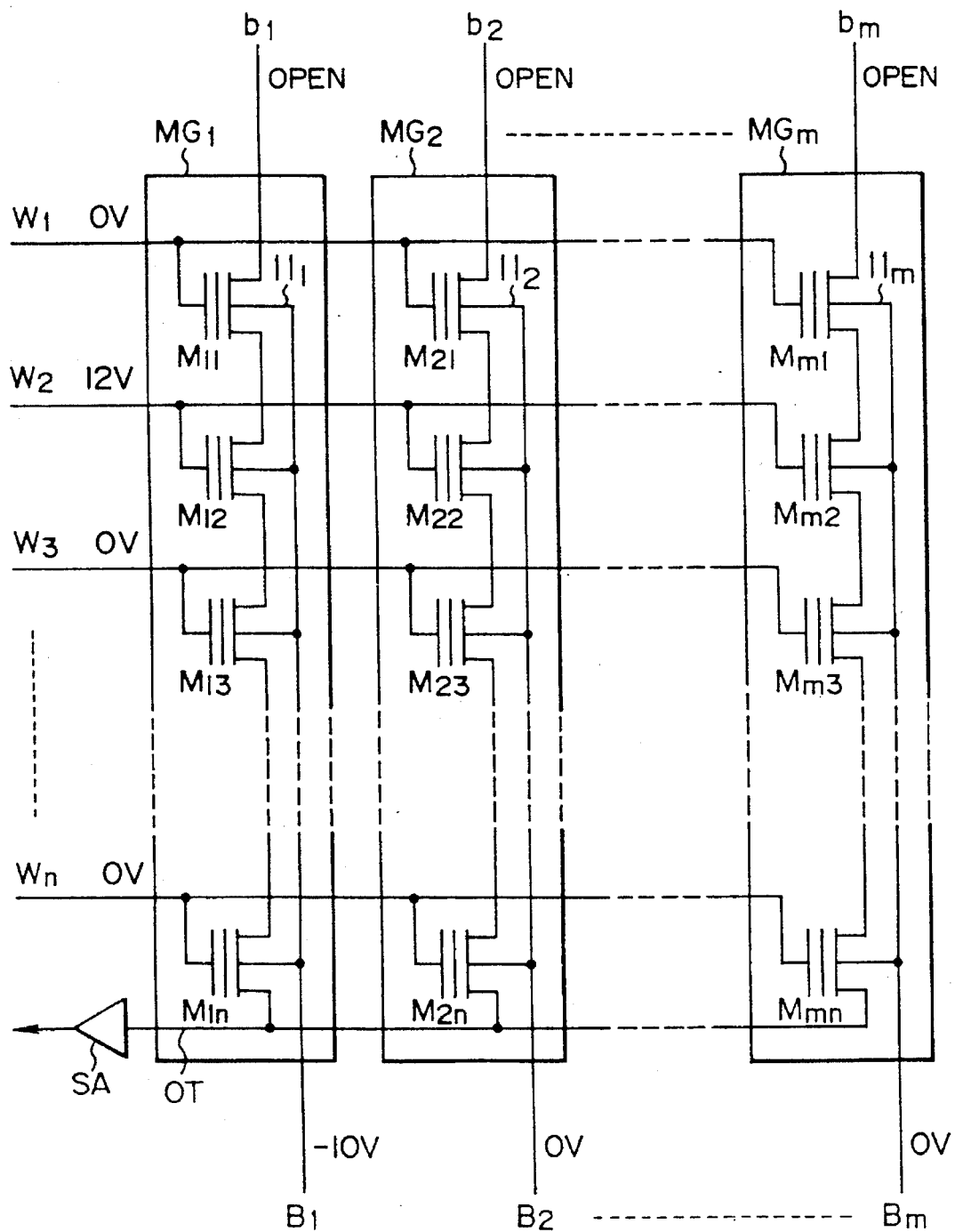
FIG. 2 is a diagram for explaining the erasing operation of the non-volatile semiconductor memory device of the invention.
Figure 4:
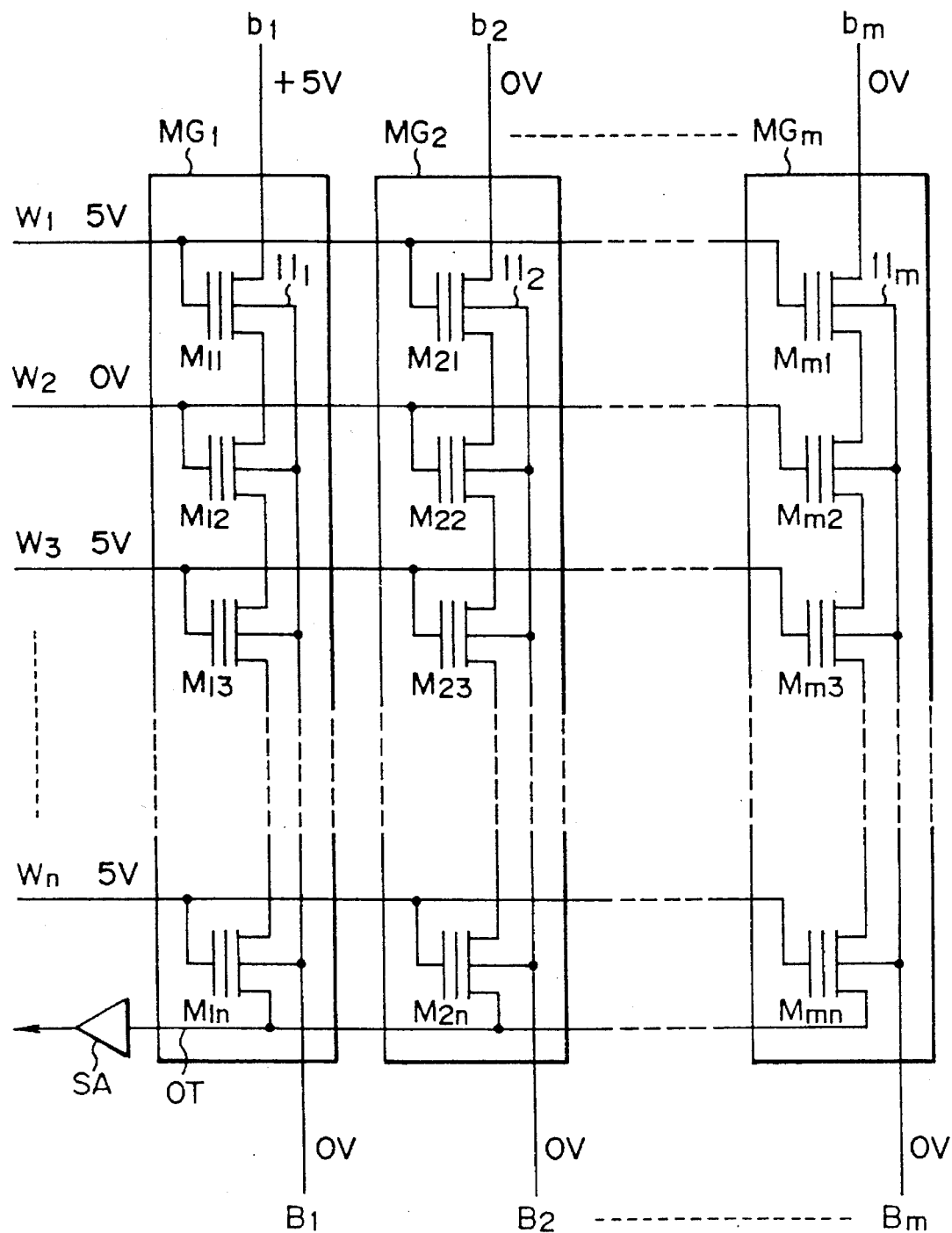
FIG. 4 is a diagram for explaining the reading operation of the non-volatile semiconductor memory device of the invention.

In FIGS. 2, 3, and 4, the voltages −10 V, −9 V, 5 V, 9 V and 12 V which are to be applied to the word lines W1 to Wn, main bit lines B1 to Bm, and sub-bit lines b1 to bm are generated by a high voltage generation control circuit 50 in FIG. 16 and are applied to the word lines W1 to Wn, main bit lines B1 to Bm, and sub-bit lines b1 to bm as selected in accordance with the erasing, writing, and reading modes through a column decoder 54 and a row decoder 56, respectively.

Circuit constructions of the row decoder and column decoder for applying the voltages at various levels generated by the high voltage generation control circuit to the word lines, main bit lines, and sub-bit lines selected in accordance with the respective modes are principally the same as those of the row decoder and the column decoder which are used to apply the voltages at various levels to the word lines and bit lines selected in accordance with the modes in the conventional non-volatile semiconductor memory device having only the word lines and the main bit lines and no circuit corresponding to the sub-bit lines. Therefore, the detailed descriptions thereof are omitted here.

Each of the memory blocks MB1, MB2, . . . , MB8 shown in FIG. 16 includes the memory cell groups MG1 to MGm shown in FIG. 1 and the information of one byte (8 bits) can be simultaneously altered by the eight memory cells, each selected from one memory block. In another embodiment, the number of memory blocks is set to 16 and the 16 memory cells each selected from one memory block are combined into one set so that the information of one word (16 bits) can be simultaneously altered.

As mentioned above, it is possible to select only one of the memory cells in the memory block in FIG. 1 at a time or to select simultaneously a plurality of memory cells thereof disposed in the same column or row. Therefore, as shown in FIG. 16 as an example, the data of one byte can be also distributed to be stored into eight memory blocks. However, the data of one byte can be stored into eight memory cells on the same row in one memory block or can be also stored into eight memory cells on the same column in one memory block in the same manner as in the conventional NAND structure.

With respect to the erasing and writing operations, there is no limitation about into which set of memory cells the data of one byte is stored. However, with regard to the reading operation, there is a limitation in the read-out sequence in relation to the number of sense amplifiers, selective connection thereof to the sub-bit lines, and the like. For example, as shown in FIG. 1, in the construction such that one sense amplifier is provided to one memory block, when the data of one byte is stored in eight memory cells on the same column or row in one memory plane, the bits of one byte are sequentially read out one by one through the one sense amplifier in the same manner as the conventional NAND structure. The word lines or bit lines in one memory plane can be also divided into groups each including 8 word or bit lines so that each group can be selected by a selection transistor.

Figure 5:
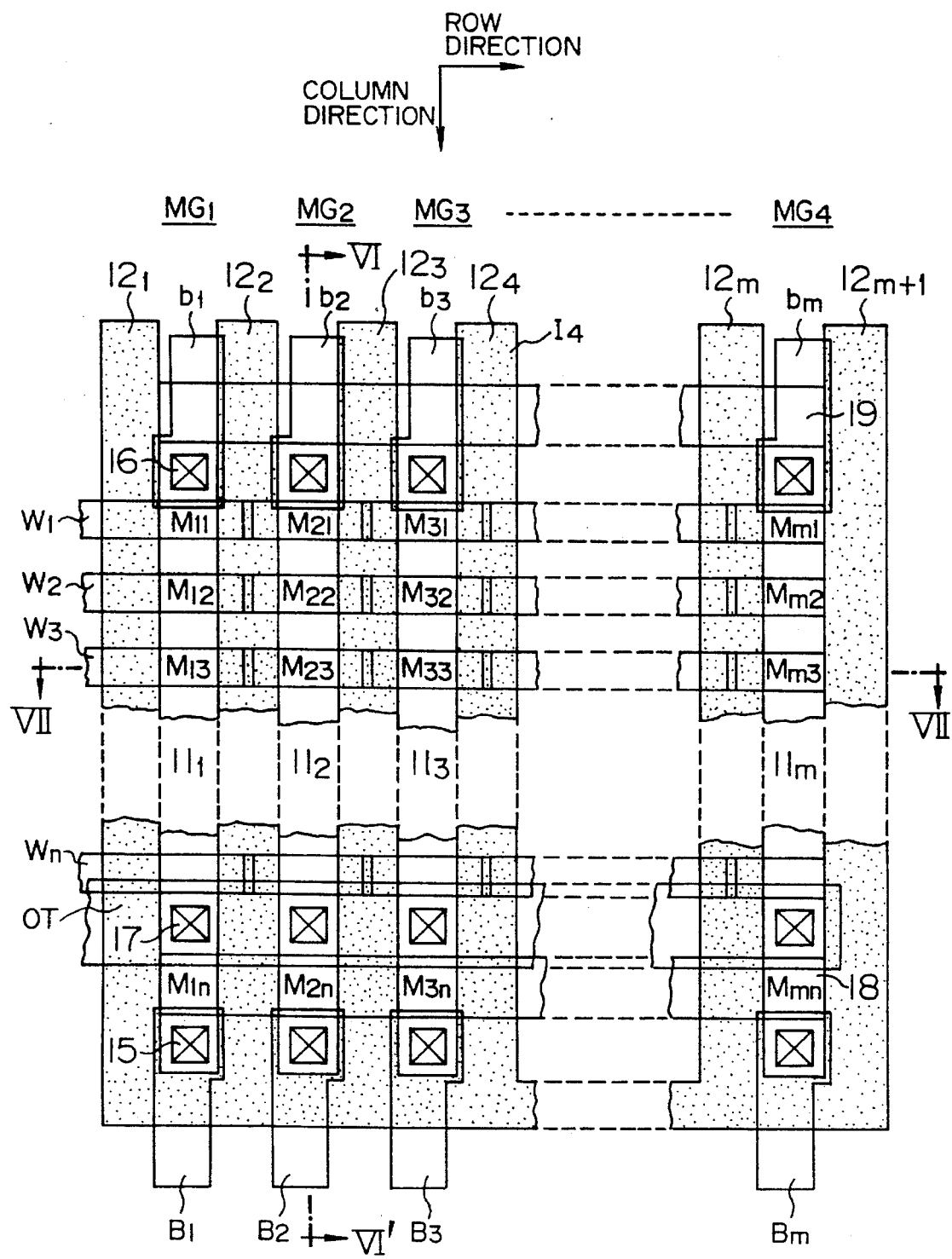
FIG. 5 is a plain view showing a structure of a main section of a memory block in FIG. 1.
Figure 6:
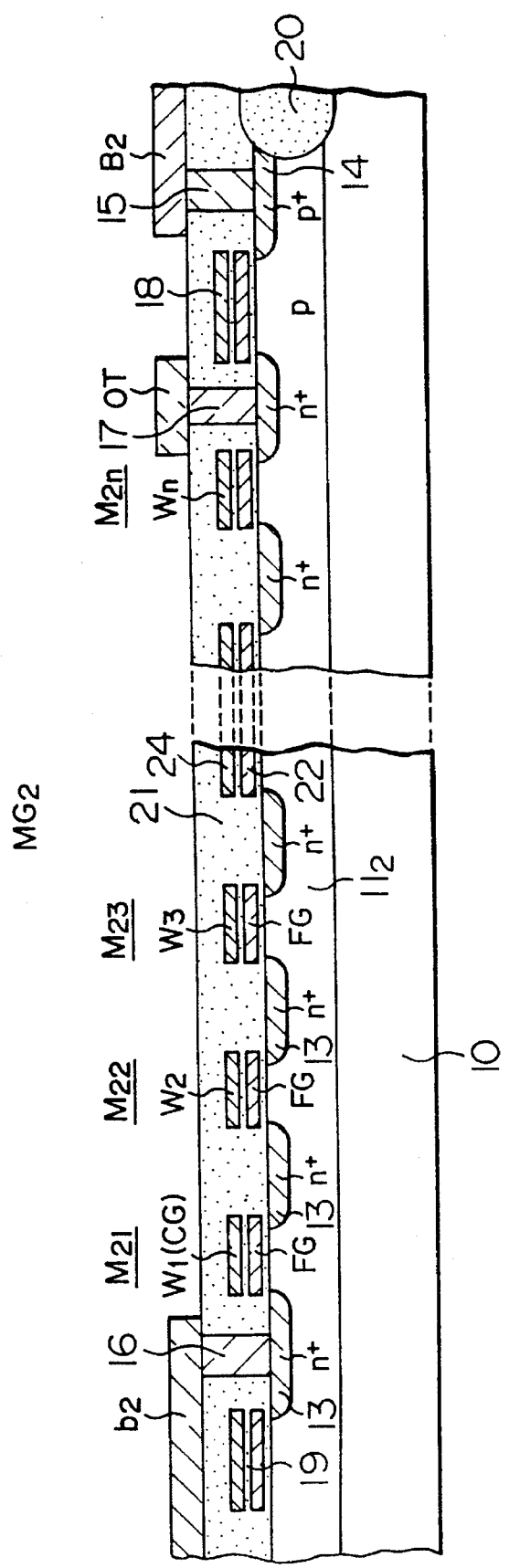
FIG. 6 is a cross sectional view taken along the line VI—VI' in FIG. 5.
Figure 7:
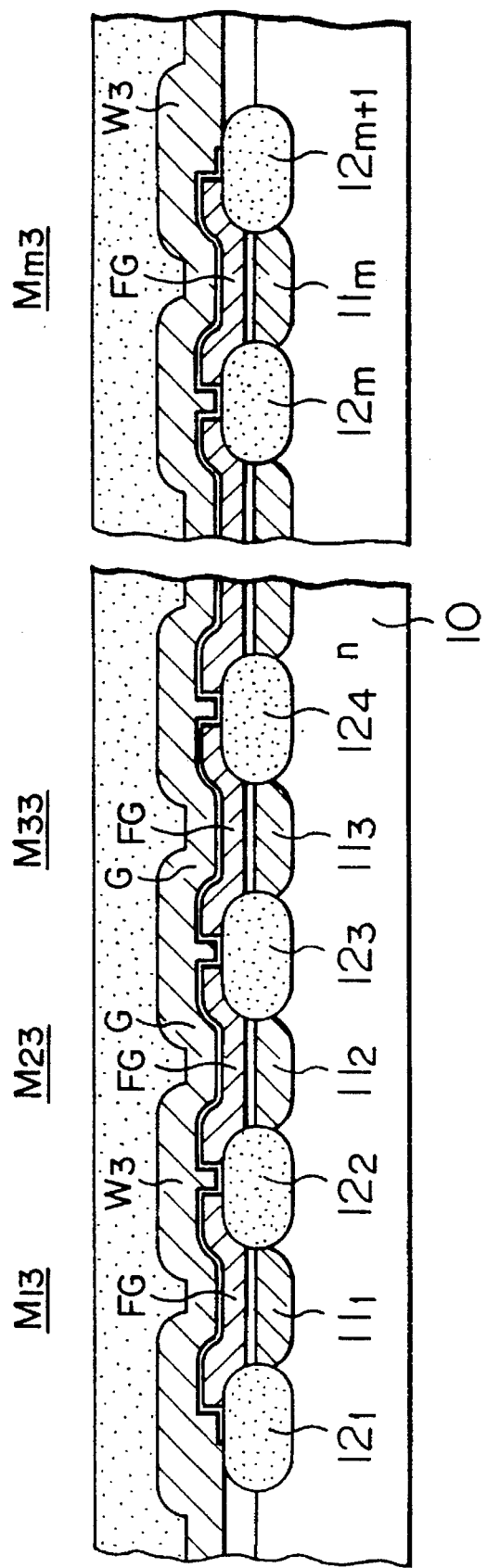
FIG. 7 is a cross sectional view taken along the line VII—VII' in FIG. 5.

FIG. 5 is a plane view of a non-volatile semiconductor memory device having an equivalent circuit shown in FIG. 1. FIG. 6 is a cross sectional view taken along the line VI—VI' in FIG. 5 and FIG. 7 is a cross sectional view taken along the line VII—VII' in FIG. 5. Referring now to FIG. 5, in the non-volatile semiconductor memory device, m memory cell groups MG1, MG2, . . . , MGm, each including n non-volatile memory cells arranged in the column direction, are arranged in the row direction, thereby forming a memory plane in which the memory cells M11 to Mmn are arranged two-dimensionally.

The n memory cells which belong to each of the memory cell groups MG1, MG2, . . . , MGm, as shown in FIG. 6 illustrating typically the cross-sections of n memory cells M21, M22, M23, . . . , M2n in the memory cell group MG2, are connected in series by using the source region of an $n^+$-type diffusion layer 13 of each memory cell commonly to a drain region of an adjacent memory cell and its drain region of the $n^+$-type diffusion layer 13 commonly with the source region of another adjacent memory cell. The drain region of the memory cell M21 disposed at one end is connected to the corresponding sub-bit line b2 through an embedded tungsten plug 16. The source region of the memory cell M2n disposed at the other end is connected to the output line OT which is common to the memory cell group through an embedded tungsten plug 17.

Further, referring to FIG. 6, a first gate oxide film 22 called a tunnel oxide film and having a film thickness of about 10 nm is formed over the source and drain regions of each memory cell. A floating gate FG having a film thickness of about 150 nm and made of a polycrystalline silicon layer doped to the $n^+$-type is formed on the first gate oxide film 22. Further, a second gate insulating film 24 having a film thickness equivalent to about 20 nm of an oxide film and a laminate structure of a silicon oxide film, a silicon nitride film, and a silicon oxide film is formed on the floating gate FG. A control gate CG of a polycrystalline silicon layer having a film thickness of about 300 nm doped to the $n^+$-type is formed on the second gate insulating film 24. As mentioned above, each memory cell has an EEPROM structure of the n-channel floating gate type.

As most clearly illustrated in the cross sectional view of FIG. 7, the p-type silicon layers $11_1$, $11_2$, . . . , $11_m$, on the surfaces of which the memory cell groups MG1, MG2 . . .

, MGm are formed, extend in the column direction while being mutually isolated in the row direction by element-isolation insulating layers $12_1, 12_2, \ldots, 12_{m+1}$ which are separated at equal intervals in the row direction on an n-type high resistance semiconductor or silicon substrate 10 and extend in parallel with each other in the column direction. As shown in FIG. 6 in which the p-type silicon layer $11_2$ is illustrated, each of the p-type silicon layers $11_1, 11_2, \ldots, 11_m$ is connected to one of the main bit lines B1, B2, ..., Bm through a p$^+$-type contact layer 14 and an embedded tungsten plug 15, so that the potentials thereof can be controlled independently of each other by the corresponding bit lines.

Referring to FIG. 6, between the n$^+$-type diffusion layer 13, which provides the source region of the memory cell M2n locating at one end of a group of memory cells serially connected, and the p$^+$-type contact layer 14, there is formed a shield gate 18 to shield both of the layers 13 and 14. The shield gate 18 is constructed to have its floating gate FG and control gate CG short-circuited with each other and fixed to a given reference potential. A shield gate 19 having the same structure as mentioned above is also formed at the outside of the n$^+$-type diffusion layer 13 providing the drain region of the memory cell M21 located at the other end of the memory cell group. Further, as shown in FIG. 7, in which the word line W3 is illustrated, the control gates CG of the memory cells (memory cells M13, M23, M33, ..., Mm3 with respect to the word line W3) disposed in the same row in the respective memory cell groups MG1, MG2, ..., MGm are connected to one of a plurality of word lines which are separated in the column direction and extend in the row direction.

Figure 8:
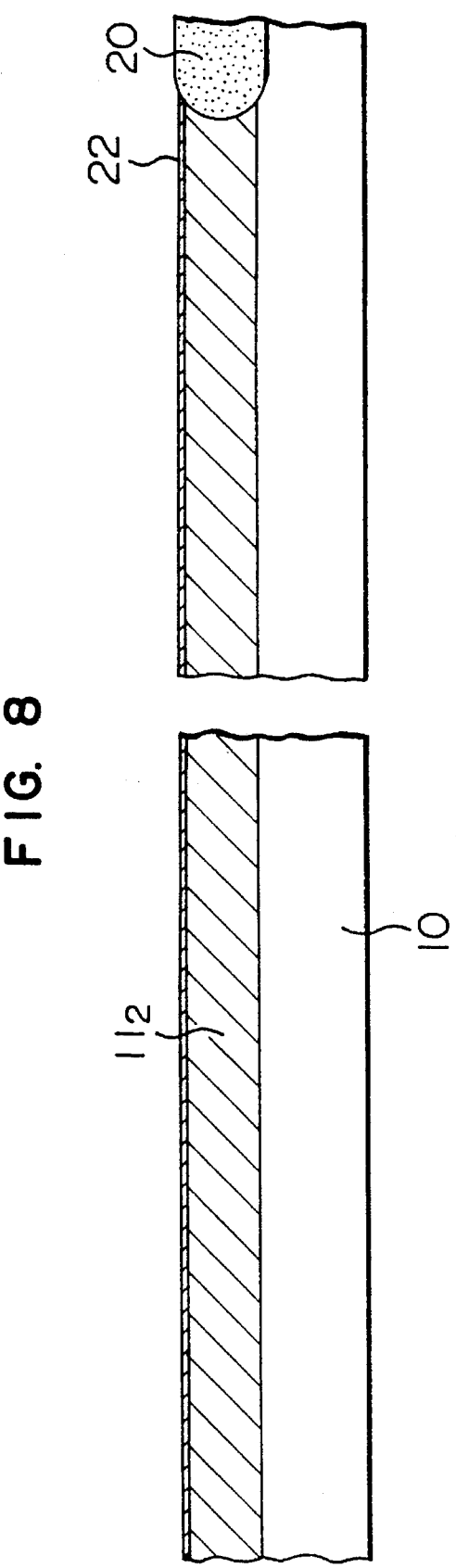
FIGS. 8 to 13 are cross sectional views corresponding to FIG. 6 which are used for explaining the steps of a method of manufacturing the memory block in FIG. 5.

An example of a method of manufacturing the non-volatile semiconductor memory device having the structure shown in FIGS. 5 to 7 will now be described with reference to FIGS. 8 to 13 corresponding to the cross sectional view of FIG. 6. First, as shown in FIG. 8, an active region is formed on the n-type silicon substrate and an element-isolation insulating layer 20 is formed by a localized oxidation method (LOCOS method). At the same time, the element isolation insulating layers $12_1$ to $12_m$ which are disposed at equal intervals in the row direction as shown in FIG. 6 are also formed. In one example, the element isolation insulating layer is formed of a layer having a film thickness of 400 nm which is obtained by pyrogenic oxidation at a temperature of 1000° C. for 60 minutes. Subsequently, $BF_2^+$ ions are implanted under a condition of 100 keV and $(7\times10^{13})$/cm$^2$. After that, a heat treatment is performed in the nitrogen atmosphere at 1200° C. for 60 minutes, thereby forming p-type silicon layers (wells) $11_1$ to $11_m$ at a depth less than the element isolation insulating layer. Further, the surface of the p-type silicon layer is oxidized for 10 minutes in the steam atmosphere or HCl atmosphere at a temperature in a range of 800° C. to 900° C., thereby forming a first gate insulating film (tunnel oxide film) 22 having a film thickness of about 10 nm.

Figure 9:
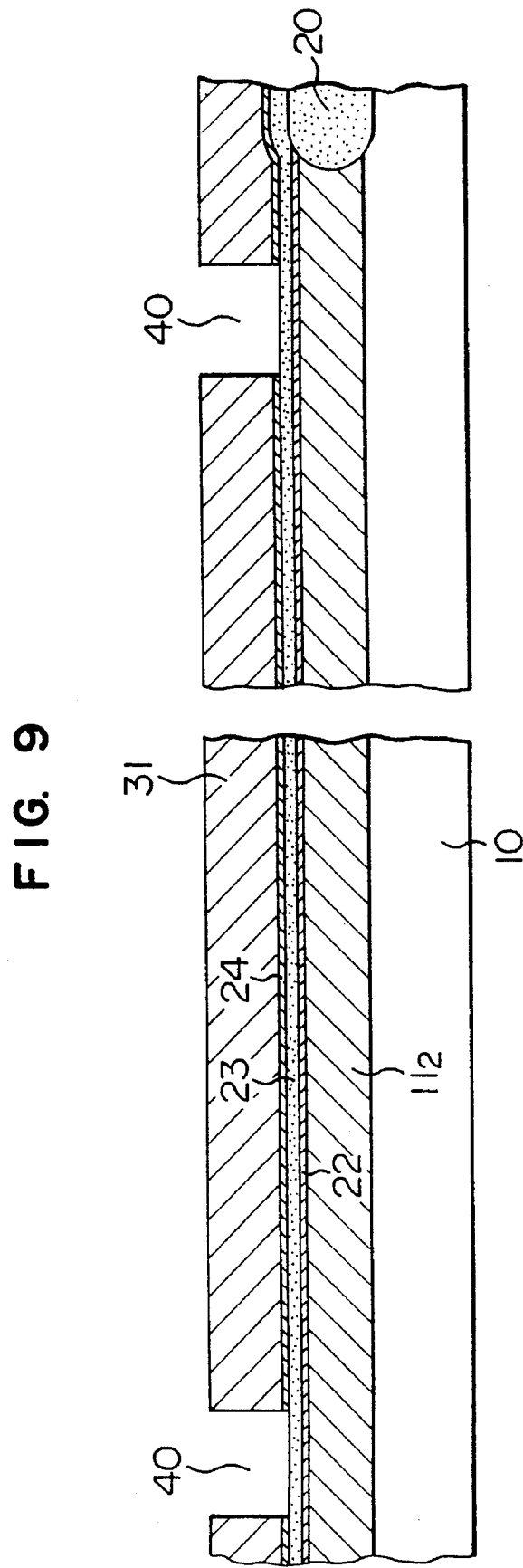

Subsequently, as shown in FIG. 9, a polycrystalline silicon layer having a thickness of 150 nm into which phosphorus ions are doped is formed by a CVD (chemical vapor deposition) method, thereby forming a polycrystalline silicon layer 23 to be used for the floating gate. By holding the layer 23 for 6 minutes in the dry oxygen atmosphere at 1000° C., an underlayer oxide film having a thickness of about 10 nm is formed on the surface of the polycrystalline silicon layer. A silicon nitride film of a thickness of 10 nm is deposited onto the underlayer oxide film by the CVD method and is left for about three hours in the steam atmosphere at 900° C., thereby forming an upper layer oxide film of a thickness of about 3 nm onto the silicon nitride film. Thus, the second gate insulating film 24 having a thickness equivalent to about 20 nm of an oxide film is formed of a laminate of the underlayer oxide film, silicon nitride film, and upper layer oxide film. The surface of the second gate insulating film 24 is covered by a photoresist layer 31 having an opening 40 over the shield gate forming portion. A portion of the second gate insulating film 24 disposed on the shield gate forming portion is removed by a reactive ion etching (RIE method).

Figure 10:
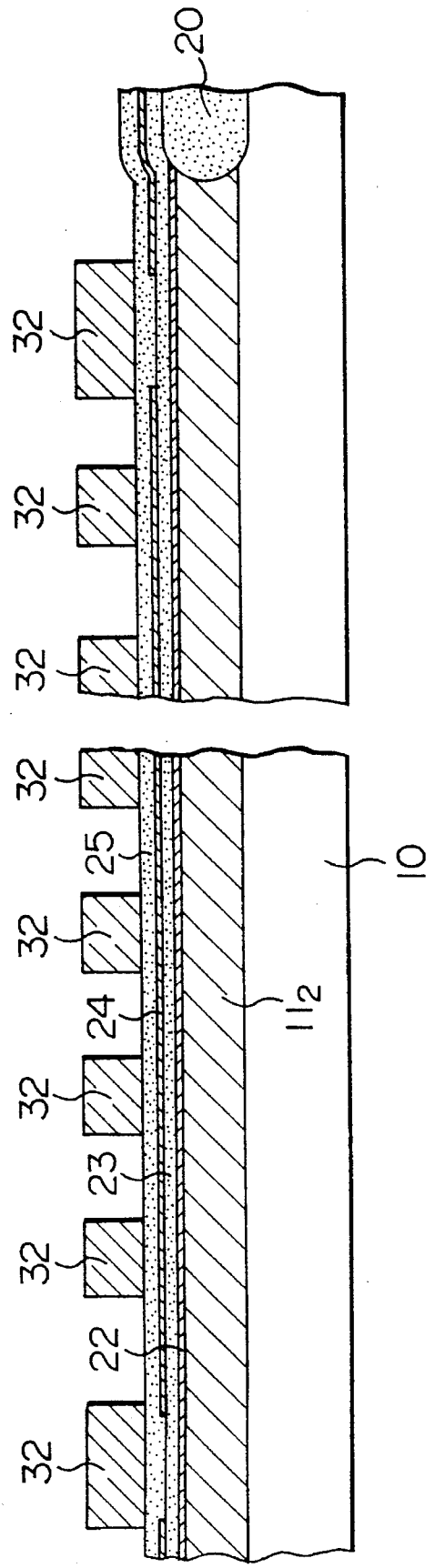

Subsequently, as shown in FIG. 10, after the photoresist layer 31 is removed, a polycrystalline silicon layer 25 into which phosphorus ions are doped is formed by the CVD method to a thickness of about 150 nm. After that, only the channel forming portion and shield gate forming portion of each memory cell are covered by photoresist 32. Subsequently, the polycrystalline silicon layer 25, second gate insulating film 24, polycrystalline silicon layer 23, and first gate insulating film 22 are sequentially self-etched in that order by the reactive ion etching method. The photoresist 32 is removed after that, thereby forming the floating gate, control gate of each memory cell and the shield gate.

Figure 11:
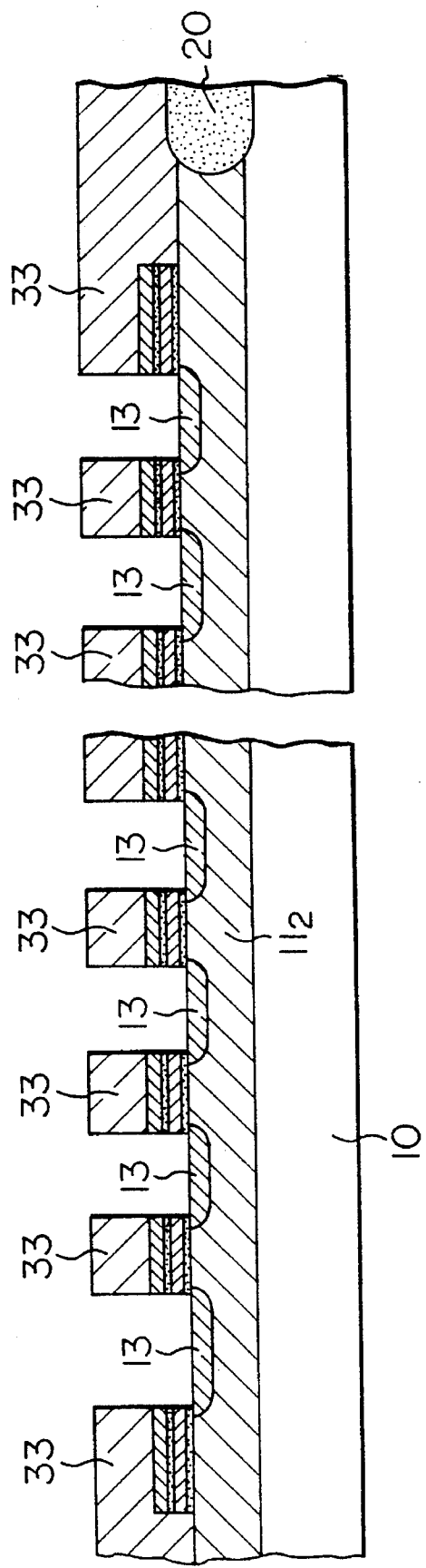
Figure 12:
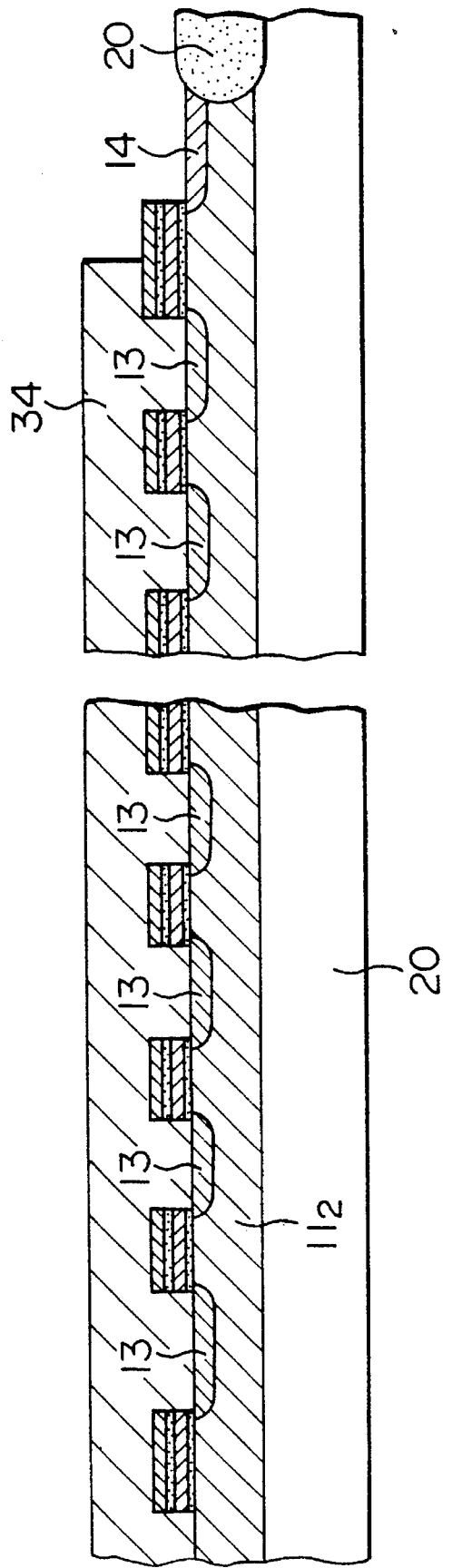

Subsequently, as shown in FIG. 11, a photoresist layer 33 is formed with openings at the portions where the source region and drain region of each memory cell are to be formed. Then, arsenic ions are implanted under the condition of 70 keV and $(5\times10^{15})$/cm$^2$, thereby forming the n$^+$-type diffusion layer 13 serving as source and drain regions. As shown in FIG. 12, a photoresist layer 34 is formed on the surface in a pattern having openings at only the portions where p$^+$ contact layers are to be formed. Ions of $BF_2$ are implanted under the condition of 70 keV and $(5\times10^{15})$/cm$^2$. After that, an annealing treatment is performed in the nitrogen atmosphere at 900° C., to form the p$^+$-type contact layer 14.

Figure 13:
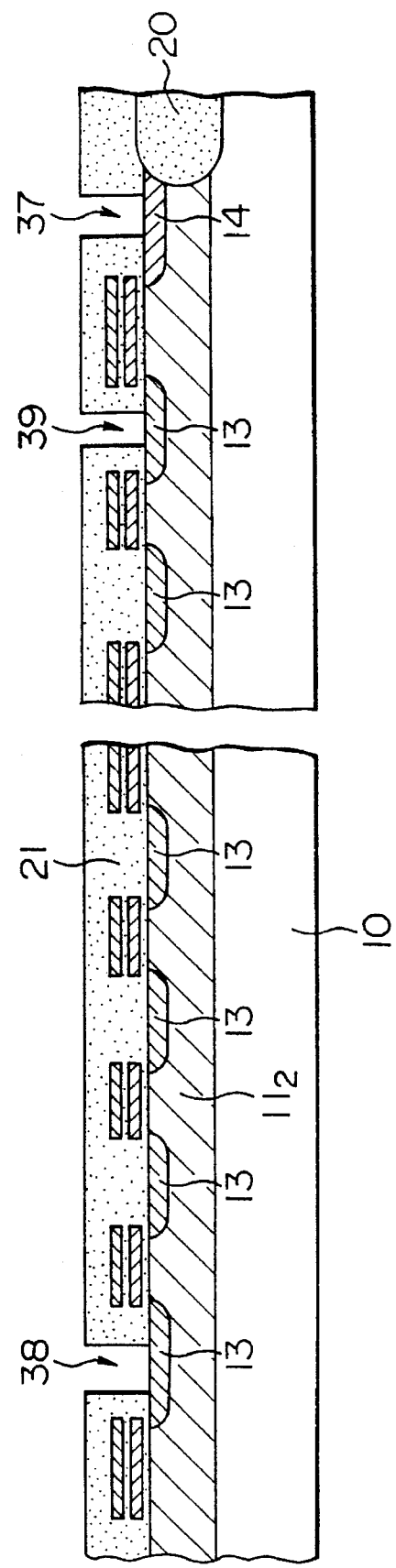

Subsequently, as shown in FIG. 13, a BPSG film doped with ions of boron and phosphorus is formed by the CVD method at the atmospheric pressure to a thickness of about 1 μm and then subjected to a reflow heat treatment, to form an interlayer insulating film 21. After that, contact holes 37, 38, and 39 are formed on the p$^+$-type contact layer 14 and the n$^+$-type diffusion layers 13 of the memory cells at both ends by patterning by a photolithography and the reactive ion etching. Then, as shown in FIG. 7, embedded tungsten plugs 15, 16, and 17 are formed in the contact holes by the selective tungsten CVD using a WF6 gas. Further, aluminum electrodes are formed on the tungsten plugs. Thereafter, the tungsten plugs 15, 16 and 17 are connected to the main bit line B2, the sub-bit line b2 and the output line OT, respectively.

Figure 14:
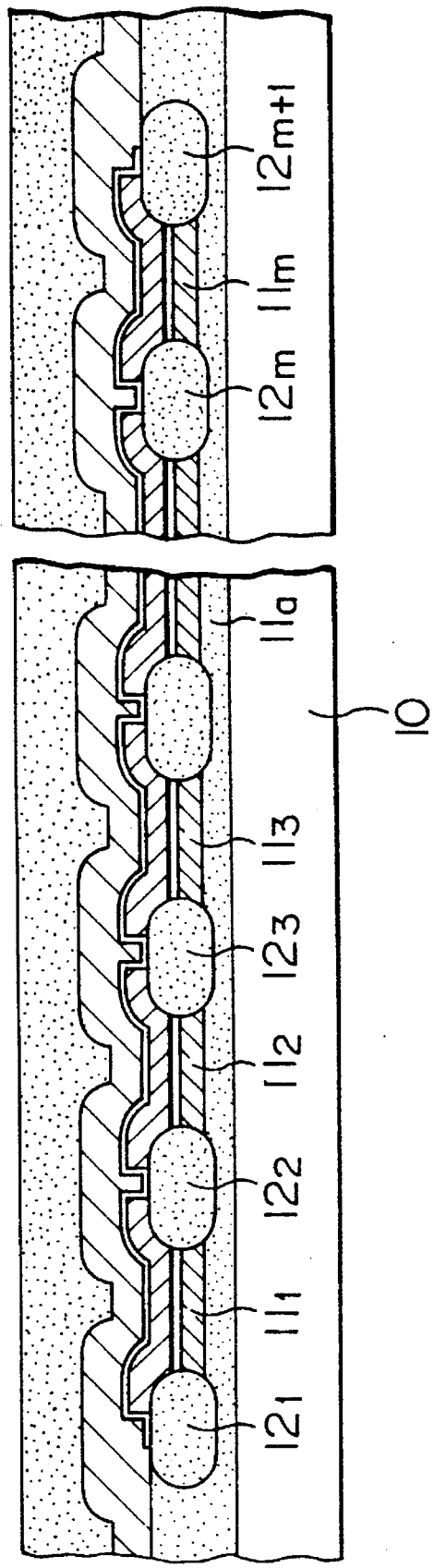
FIG. 14 is a cross sectional view which shows a structure of a memory block constructing a non-volatile semiconductor memory device according to another embodiment of the invention and which corresponds to FIG. 7.

As mentioned above, the present invention has a feature in that the semiconductor layers of the first conductivity type, on the surface of which the memory cell group corresponding to the conventional NAND structure is formed, are formed so as to be separated from each other in the row direction. These silicon layers of the first conductivity type separated in the row direction may be formed by any other suitable method. For instance, as shown in a cross sectional view of FIG. 14, it is also possible to use an SOI structure such that after a silicon layer of the first conductivity type is formed on an embedded oxide film 11a, element-isolation insulating films $12_1$ to $12_m$ having a depth reaching the embedded oxide film are formed.

In FIG. 16, a typical construction is shown, as an example, in which eight memory blocks in FIG. 1 are arranged on the extensions of the word lines and the parallel data of one byte is written into or read out from the eight memory cells, which are disposed at the same positions in the respective memory blocks. However, it is also possible to use a construction such that eight sense amplifiers are added to the memory block of FIG. 1 and a set of selected eight sub-bit lines are connected to the eight sense amplifiers, respectively, so that parallel data of one byte are read out.

As described in detail above, according to the non-volatile semiconductor memory device of the invention, the memory cell groups of almost the same construction as that of the conventional NAND type are formed on the semiconductor layers of the first conductivity type, which are separated from each other so that the potentials thereof can be individually controlled. Therefore, a random access comparable with the NOR type can be performed with a high integration density comparable with the NAND type. Thus, the present invention realizes both of a high density integration and a high speed operation.

Further, in the non-volatile semiconductor device of the invention, since it is constructed such that the tunneling to the floating gate is effected from the wide channel region, it is possible to prevent deterioration of the tunnel oxide film which would be derived from the drain/source region-sided channeling in the conventional NAND type, thereby realizing the high reliability and the long life.

I claim:

1. A non-volatile semiconductor memory device comprising:

a plurality of semiconductor layers of a first conductivity type, said semiconductor layers extending parallelly in a column direction and being isolated from each other;

a plurality of memory cells disposed in a matrix of columns and rows, each memory cell having source and drain regions of a second conductivity type different from said first conductivity type, a channel region formed between said source and drain regions and a gate structure formed on the channel region with a gate insulating layer interposed therebetween and including a floating gate, an interlayer insulating layer and a control gate, said memory cells being divided into a plurality of memory cell groups formed on the semiconductor layers, respectively, so that all the memory cells included in one of said memory cell groups are formed on one of the semiconductor layers respectively and drain-source circuits of the memory cells of each group are connected in series to provide a series electrical path;

a plurality of first bit lines provided to said plurality of memory cell groups, respectively, each first bit line being connected to the semiconductor layer on which the memory cells included in an associated one of said plurality of memory cell groups are formed;

a plurality of second bit lines provided to said plurality of memory cell groups, respectively, each second bit line being connected to one end of the series electrical path provided to the memory cells included in an associated one of said plurality of memory cell groups: and a plurality of word lines, each word line being connected to the control gates of the memory cells disposed in one of the rows.

2. A non-volatile semiconductor memory device according to claim 1, further comprising:

means for selecting one or more of said plurality of word lines and applying selected voltages to said selected word lines and non-selected word lines, respectively;

means for selecting one or more of said first bit lines and applying selected voltages to said selected word lines and non-selected word lines, respectively; and means for selecting one or more of said plurality of second bit lines and applying selected voltages to said selected word lines and non-selected word lines, respectively.

3. A non-volatile semiconductor memory device according to claim 1, further comprising:

means for selecting one of said plurality of word lines connected to the control gate of the memory cell to be written or erased;

means for applying a selected voltage to said selected word line;

means for selecting one of said plurality of first bit lines associated with the memory cell group in which said memory cell to be written or erased is included; and means for applying a selected voltage to said selected first bit line.

4. A non-volatile semiconductor memory device according to claim 1, further comprising:

means for selecting one of said plurality of first bit lines associated with one of said memory cell groups to be written or erased;

means for applying a selected voltage to said selected first bit line; and means for applying a selected voltage to each of said plurality of word lines.

5. A non-volatile semiconductor memory device according to claim 1, further comprising:

means for selecting one of said plurality of word lines connected to the control gates of the plurality of memory cells disposed on one of the rows to be written or erased;

means for applying a selected voltage to said selected word line; and means for applying a selected voltage to each of said plurality of first bit lines.

6. A non-volatile semiconductor memory device according to claim 1, wherein said plurality of semiconductor layers of the first conductivity type are formed on a high resistance semiconductor layer of the second conductivity type different from said first conductivity type and adjacent two of said semiconductor layers of the first conductivity type are isolated from each other by an element-isolation insulating layer formed on said high resistance semiconductor layer and extending in the direction of column, 7. A non-volatile semiconductor memory device according to claim 1, wherein said floating gate and said control gate are made of polycrystalline silicon layers and said interlayer insulating layer has a multilayer structure of an underlayer oxide layer, a silicon nitride layer and an upper-layer oxide layer.

8. A non-volatile semiconductor memory device according to claim 1, further comprising an output line connected to the other end of the series electrical path provided to each of said plurality of memory cell groups.

9. A non-volatile semiconductor memory device according to claim 1, wherein said series electrical path provided to each of said plurality of memory cell groups is formed of a semiconductor layer of the second conductivity type which includes drain and source regions of the memory cells of said memory cell group formed on an associated one of said plurality of semiconductor layers of the first conductivity type, and said second bit line is connected to one end of the semiconductor layer of the second conductivity type.

10. A non-volatile semiconductor memory device according to claim 9, further comprising a contact layer of the first conductivity type which is formed on said associated one of said plurality of semiconductor layers of the first conductivity type closely to the other end of said semiconductor layer of the second conductivity type, and said first bit line is connected to said contact layer through a first contact hole formed in an upper insulating layer which covers the contact layer and the semiconductor layer of the second conductivity type.

11. A non-volatile semiconductor memory device according to claim 10, wherein said second bit line is connected to the one end of the semiconductor layer of the second conductivity type through a second contact hole formed in said upper insulating layer.

12. A non-volatile semiconductor memory device according to claim 11, further comprising an output line connected to the other end of the semiconductor layer of the second conductivity type through a third contact hole formed in said upper insulating layer.

13. A device according to claim 12, further comprising shield gates whose potentials are fixed and which are formed on the semiconductor layer of the first conductivity type at its position corresponding to a portion between the contact layer of the first conductivity type and the other end of the semiconductor layer of the second conductivity type and at its other position near to said one end of the semiconductor layer of the second conductivity type, respectively.

14. A non-volatile semiconductor memory device according to claim 1, wherein said plurality of semiconductor layers of the first conductivity type are formed on an embedded insulating layer, and adjacent two of said semiconductor layers of the first conductivity type are isolated by an element isolation insulating layer extending in the direction of column on said embedded insulating layer.

15. A non-volatile semiconductor memory device according to claim 1, further comprising:
   a plurality of memory blocks, each including a plurality of said memory cell groups; and
   means for simultaneously writing, reading, and erasing into/from the memory cells selected from at least two of said memory blocks.

16. A non-volatile semiconductor memory device according to claim 15, comprising of least eight of said memory blocks, and wherein said means for simultaneously writing, reading, and erasing simultaneously performs writing, reading, and erasing of data of 8-bit unit into/from corresponding memory cells selected from said eight memory blocks, respectively.

17. A non-volatile semiconductor memory device according to claim 1, wherein said plurality of semiconductor layers are wells, respectively, formed in a semiconductor substrate and having a conductivity type different from that of said semiconductor substrate.

* * * * *